United States Patent [19]

Jordan et al.

[11] E Re. 30,504

[45] Reissued * Feb. 3, 1981

[54] PHOTOVOLTAIC CELL

[75] Inventors: John F. Jordan; Curtis M. Lampkin, both of El Paso, Tex.

[73] Assignee: Photon Power, Inc., El Paso, Tex.

[ * ] Notice: The portion of the term of this patent subsequent to Apr. 25, 1995, has been disclaimed.

[21] Appl. No.: 68,927

[22] Filed: Aug. 23, 1979

Related U.S. Patent Documents

Reissue of:

[64] Patent No.: 4,159,914
Issued: Jul. 3, 1979
Appl. No.: 892,375
Filed: Mar. 31, 1978

U.S. Applications:

[63] Continuation-in-part of Ser. No. 631,815, Nov. 14, 1975, Pat. No. 4,086,101, which is a continuation-in-part of Ser. No. 508,570, Sep. 23, 1974, abandoned, which is a continuation-in-part of Ser. No. 431,705, Jan. 8, 1974, Pat. No. 3,880,633.

[51] Int. Cl.[3] ..... H01L 31/04

[52] U.S. Cl. ..... 136/258; 136/260; 357/30; 357/59; 357/62; 427/74

[58] Field of Search ..... 136/89 TF, 89 CD; 357/30, 59, 62

[56] References Cited

U.S. PATENT DOCUMENTS

| | | | |
|---|---|---|---|
| 2,912,370 | 11/1959 | Taverna | 204/50 Y |
| 3,975,211 | 8/1976 | Shirland | 136/89 |
| 4,086,101 | 4/1978 | Jordan et al. | 136/89 CD |

*Primary Examiner*—Aaron Weisstuch
*Attorney, Agent, or Firm*—Bard & Groves

[57] ABSTRACT

A photovoltaic cell having an electrically conductive substrate, which may be glass having a film of conductive tin oxide; a first layer containing a suitable semiconductor, which layer has a first component film with an amorphous structure and a second component film with a polycrystalline structure; a second layer forming a heterojunction with the first layer; and suitable electrodes where the heterojunction is formed from a solution containing copper, the amorphous film component is superposed above an electrically conductive substrate to resist permeation of the copper-containing material to shorting electrical contact with the substrate. The penetration resistant amorphous layer permits a variety of processes to be used in forming the heterojunction with even very thin layers (1-6$\mu$ thick) of underlying polycrystalline semi-conductor materials. In some embodiments, the amorphous-like structure may be formed by the addition of aluminum or zirconium compounds to a solution of cadmium salts sprayed over a heated substrate.

21 Claims, No Drawings

PHOTOVOLTAIC CELL

Matter enclosed in heavy brackets [ ] appears in the original patent but forms no part of this reissue specification; matter printed in italics indicates the additions made by reissue.

BACKGROUND OF THE INVENTION

This application is a continuation-in-part of our prior application for U.S. patent, Ser. No. 631,815 filed Nov. 14, 1975 and issued Apr. 25, 1978 as U.S. Pat. No. 4,086,101, which in turn is a continuation-in-part of our prior application for U.S. patent, Ser. No. 508,570 filed Sept. 23, 1974, and now abandoned, which is a continuation-in-part of our prior application for U.S. patent, Ser. No. 431,705, filed Jan. 8, 1974, and issued Apr. 29, 1975 as U.S. Pat. No. 3,880,633, all of the above being assigned to a common assignee.

It is known to form photovoltaic cells by coating on a hot sheet of Nesa glass, or glass previously coated with $SnO_x$, a thin film of CdS, by spraying a water solution of compounds which form a layer of CdS microcrystals on the $SnO_x$, and providing a $Cu_xS$ heterojunction as a layer on the CdS layer, and forming electrodes on the film of $Cu_xS$. In accordance with our prior applications, referred to hereinabove, the $Cu_xS$ layer may be formed by spraying a $Cu_xS$-forming solution on the CdS film while the substrate was hot, or the $Cu_xS$ may instead be formed by dipping or by electroplating, or by a combination of both, at or near room temperature.

Photovoltaic cells have heretofore utilized relatively thick films of CdS, or have resorted to other expedients to obviate the difficulty that CdS films generally permit permeation by $Cu_xS$ and Cu, when $Cu_xS$ is formed by dipping or electroplating, i.e., by ion exchange. This permeation provides short circuits between the $Cu_xS$ layer and the $SnO_x$, the latter constituting the negative electrode of the cell, rendering the cell inoperative. In order to convert solar energy to electrical energy on a large scale, square miles of solar cells may be required. Since Cd is a rare and expensive metal, it becomes important to form photovoltaic cells with minimum quantities of CdS and hence with extremely thin CdS films. Moreover the cells must be reliably fabricated and have long life.

We have produced photovoltaic cells having layers of CdS and with a total thickness of about 2 to 6 microns thick, yet which show zero shorting permeation, at least one of the layers being highly resistant to permeation by $Cu_xS$-or Cu-containing solution. We have heretofore used the method of spraying a solution which forms CdS on a glass coated with $SnO_x$, the spray being intermittent and covering only a small portion of the glass at a given point in time, while the surface of the glass is maintained at a uniform and constant temperature in the range between 230° C. and 600° C.

According to the present invention, in one embodiment, multiple spray applications are required to form the CdS layer. Each spray comprises a solution containing a cadmium compound and a sulphur containing compound. However, to one spray is added a metallic compound, such as $AlCl_3.6H_2O$, in proportions such that the metal content is at least 10 molar percent of the total metal ion content of the solution. In a superposed spray solution, a second layer of generally pure CdS is formed.

Instead of applying two discrete films, one formed from a spray containing a large quantity of metallic compound and the other containing little or none, a single film may be formed by gradually decreasing the metallic compound content of the solution being sprayed in proceeding from the stratum of the film adjacent to the $SnO_x$ layer to the stratum of the film adjacent to the exposed surface of the CdS film. In this manner the stratum of the CdS film adjacent to the $SnO_x$ layer contains significantly greater quantities of the metal in a second compound form than the stratum of the film adjacent to the exposed surface of the CdS film.

After heat treatment at a temperature in the range of 400° C. to 550° C., it is found that the portion of the CdS layer containing the second metallic compound is extremely hard and highly adherent to the $SnO_x$ layer, so that it can only with difficulty be removed by application of acid or by scraping and is highly resistant to permeation by chemicals involved in forming a $Cu_xS$ layer by ion exchange, or to $Cu_xS$, and inhibits diffusion of Cu through a CdS layer. The metallic compound in the CdS film is in the relatively large quantities resulting from use of solutions containing the selected metal in a quantity representing at least 10 molar percent of the total metal ion content of the solution and does not constitute a doping procedure, such as disclosed in Middleton, et al., U.S. Pat. No. 3,411,050. Rather it comprises a compound or material having properties quite distinct from those of CdS or CdS containing only small amounts of metallic materials. It has been found that even if the entire film of CdS includes these large quantities of metallic compounds the cell remains operative, but at reduced efficiency.

SUMMARY OF THE INVENTION

A photovoltaic cell is provided with a material layer which is highly resistant to permeation by copper containing compounds. The permeation resistant layer precludes the formation of internal short circuit paths by copper and copper compounds and enables the production of large area photovoltaic panels for the production of useful quantities of electrical energy from incident solar radiation.

A preferred embodiment is the $CdS/Cu_xS$ photovoltaic cell. The cell includes a transparent substrate having an electrically conductive and transparent coating, which may be $SnO_x$; one or more layers of CdS superposed over said conductive coating, at least one of the CdS layers including a metallic compound which produces an amorphous-like structure; a layer of $Cu_xS$ forming a photovoltaic heterojunction with the CdS; and electrodes for electrically interconnecting the cells. In various embodiments the metallic compound includes aluminum (Al) or zirconium (Zn). The CdS layer containing the metallic compound is formed from a solution containing a cadmium salt and a compound containing the selected metal, the selected metal forming at least 10 molar percent of the solution.

An advantage of the present invention is the formation of large area photovoltaic panels without internal short circuit paths.

Another advantage of the present invention is to permit forming a heterojunction by processes including spraying, dipping, or electroplating.

Yet another advantage of the present invention is the use of very thin films of CdS, conserving available cadmium resources.

DETAILED DISCLOSURE

The disclosure of the co-pending parent applications are hereby imported by reference into this application, the process as there disclosed being applied to a glass substrate as the glass substrate travels through a plurality of heated zones which may be tanks containing a molten salt or a molten metal. Alternately, heat may be supplied by other convenient means, such as radiative heating. In the course of spraying the substrate with solution, the upper surface of the substrate is cooled by the spray. It is then desirable to conduct the spraying operation so that the substrate surface can acquire from the heated zone enough heat to recover the temperature of the exposed surface of the substrate between the sprays applied by any area. This process provides a uniform layer thickness, and also facilitates maintenance of constant temperature, or maintains the temperature more nearly constant than is otherwise feasible.

Subject to the considerations stated in the immediately preceding paragraph, glass is heated to maintain the exposed surface of the glass at a temperature in the range 230° C. to 600° C., and it is assumed for the purpose of the present invention that the glass has been coated with $SnO_x$ in a thin transparent layer, or by the methods taught in our parent application.

In a conventional photovoltaic cell, a layer of CdS or other suitable semiconductor material is formed which is polycrystalline in nature. A layer of $Cu_xS$ is then formed over the CdS by spray depositing a solution which reacts chemically to form $Cu_xS$ or by an ion exchange process involving dipping the CdS layer in a solution of copper ions whereby $Cu_xS$ is formed by a Cd-Cu ion-exchange mechanism. In some cases, an electric field has been applied in an attempt to drive this process. Finally, electrodes are applied to facilitate external interconnections.

It has been found that the copper-containing compounds tend to permeate the CdS polycrystalline structure, particularly concentrating along crystallite grain boundaries. The permeation is most pronounced in an extended ion-exchange immersion and least pronounced in a chemical spray. If the permeation is completed, i.e. the copper-containing compounds extend through the polycrystalline structure to the $SnO_x$, an internal low resistance path is created which short circuits the surrounding CdS and renders inactive at least a portion of the photovoltaic cell.

In accordance with the present invention, a layer is included within the layered photovoltaic cell structure which acts to inhibit or prevent permeation of the copper-containing compounds to the electrically conductive surface. This permeation resistance is provided by an amorphous-like structure without discernible grain boundaries. It has been found desirable to form at least a portion of the amorphous-like layer from the same semiconductor material as the overlying polycrystalline layer. The inclusion of other metal containing compounds provides enough disruption of the defined crystal lattice to result in a structure which appears amorphous even under a magnification of 100,000X by a scanning electron microscope. However, x-ray diffraction techniques indicate the presence of some crystal structure.

Where aluminum is used in the metal containing compound, it is believed that alumina ($Al_2O_3$) is formed during the chemical reaction on the sprayed surface. The exact structure of the layer containing the Cds and $Al_2O_3$ is not known, but the layer is not completely dissolved by HCl, as is normal CdS, and the amorphous-like layer remains partially intact when subjected to HCl. This would suggest that the $Al_2O_3$ is not segregated in any particular segment of the layer.

While aluminum is the preferred metal because of cost and availability, zirconium has also been used to form a permeation resistant layer and may be provided in the same molar formulation as the aluminum. It is believed that zirconium could be substituted for aluminum on a mole-for-mole basis in any of the examples hereinbelow set forth.

It is believed that the permeation resistant layer is applicable to any photovoltaic cell having a polycrystalline semiconductor layer, particularly where $Cu_xS$ forms the heterojunction with the polycrystalline substance. Further, other materials which result in a suitable amorphous structure may become apparent to those skilled in the art and employed according to the present invention.

Actual formulations which have produced permeation resistant layers according to our invention are hereinafter set forth:

EXAMPLE I

In a first example of the invention, two solutions are prepared. The first solution may be in the proportion:

2 liters—Water
60 cc—$CdCl_2$ (1 Molar solution)
74 cc—Thiourea (1 Molar solution)
1.95 gm—$AlCl_3.6H_2O$ The second solution employed is in the proportion:

5 liters—Water
150 cc—Thiourea (1 Molar solution)
150 cc—$CdCl_2$ (1 Molar solution)
2.5 cc—HCl (CONC. 12N)

While thiourea is specified as a component, its function is to produce sulphur. Other compounds which are soluble in water, and which give up sulphur, can be substituted. Specifically N,N-Dimethyl thiourea has been employed, but thiourea is the least expensive compound which has been found satisfactory. The specific quantity of $AlCl_3.6H_2O$ is usually greater than 10 molar percent and may be increased over a wide range. In some instances it has also been found that an excess of sulfur is desirable and the quantity of available sulfur may be increased as the aluminum content is increased.

Molar percentages of aluminum even higher than 50 molar percent may be utilized but higher percentages have not been found to produce superior performance. The CdS film having an Al compound therein formed with a solution having an Al content of from 10 to 50 molar percent of the total metal ion content of the solution is found to have properties quite different from CdS films containing no aluminum or relatively small amounts of aluminum. The layer is extremely hard, impervious to $Cu_xS$ or Cu, and is highly adherent to the $SnO_x$.

The second solution forms a layer containing only CdS, generally in crystalline form as present in a conventional photovoltaic cell. It is possible to include small quantities of impurity metals, such as zinc, to dope the CdS and alter the semiconductor properties in ways well known in the art. Inclusion of HCl is optional, and for reasons unknown increases slightly the voltage output of the cell, but so far as is known does not otherwise affect the operation of the cell.

EXAMPLE II

Similar to EXAMPLE I, but with the solutions being differently comprised. The first solution may be in the proportion:

8 liters—Water
18.63 gm—$CdCl_2.2\frac{1}{2}H_2O$ 8.77 gm—Thiourea
6.96 gm—$AlCl_3.6H_2O$
2 cc—Hydrochloric acid The second solution may be in the proportion:

4 liters—Water
24.70 gm—$CdCl_2.2\frac{1}{2}H_2O$
10.96 gm—Thiourea

EXAMPLE III

A solution of water, $CdCl_2$, thiourea and $AlCl_3.6H_2O$ is sprayed on glass coated with $SnO_x$, but as the spray proceeds the proportion of $AlCl_3.6H_2O$ to $CdCl_2$ is gradually decreased, for example, logarithmically. For example, as much as 50 molar percent aluminum may be present in the solution forming the lowermost part of the CdS film, and zero or substantially zero molar percent aluminum in the solution forming the upper surface of the film.

EXAMPLE IV

A first solution is prepared in the proportions:

8 liters—Water
18.63 gm—$CdCl_2.2\frac{1}{2}H_2O$
6.718 gm—$ZrCl_4$
8.77 gm—Thiourea A second solution may be prepared according to either Example I or II to form the layer of CdS.

EXAMPLE V

A concentrated first solution is prepared in the proportions:

800 cc—Water
13.7 gm—$CdCl_2.2\frac{1}{2}H_2O$
4.83 gm—$AlCl_3.6H_2O$
6.85 gm—Thiourea A concentrated second solution is prepared in the proportions:

800 cc—Water
13.7 gm—$CdCl_2.2\frac{1}{2}H_2O$
9.13 gm—Thiourea
7.33 cc—$HNO_3$(3N solution)

In all cases, the preferred end result is that directly in contact with the $SnO_x$ is a layer of CdS containing a metallic compound, which may be a compound of aluminum or zirconium and at the upper surface of the layer of CdS, which is to be converted to $Cu_xS$ to form a heterojunction, there is none, or very little, of the metallic compound. Two distinct layers may be employed, or a single layer may be formed having a decreasing percentage of the metallic compound in proceeding from bottom to top of the layer.

The solutions in all examples are sprayed on the glass intermittently and slowly in successive passes over a considerable period of time, of the order of 100 minutes each for the first and second coatings from Examples I, II, or IV and in the order of 180 minutes in the case of the graduated layer of Example IV. The concentrated solutions of Example V may be sprayed for only 30–40 minutes. In each case, the solution is sprayed intermittently and over only a small portion of the glass at any one instant so that the glass sheet remains at about the same average temperature during the spraying, despite the heat removed from the glass in the spraying process. The total thickness of each layer formed in this way is between about 1 to 4 microns, or less, with a total thickness of about 2–6 microns. The coated plate is, after spraying is completed, heated to a temperature of about 400° C. to 550° C. for 5–60 minutes to promote crystal growth.

After the CdS layer has been formed, the substrate is slowly cooled, and the coated product is ready for the $Cu_xS$ layer. To complete a photovoltaic cell, the exposed surface of the CdS layer is converted to $Cu_xS$ by dipping the previously cooled cell into an appropriate solution at room temperature, by electroplating, by a combination of dipping and electroplating, or by spraying thereon a suitable copper-containing solution.

After the $Cu_xS$ layer has been formed, the completed photovoltaic panel may be formed into a series interconnected array of photovoltaic cells according to our patent application Ser. No. 831,544 filed Sept. 8, 1977, which disclosure is incorporated by reference. Electrodes are attached in a preselected configuration and the photovoltaic panel is completed.

The present method can be employed with Nesa glass as the starting material, obviating the need for coating with $SnO_x$, but Nesa glass has a sheet resistivity per square of about 50–75 ohms per square, whereas by our methods very low resistivity coatings may be produced, i.e., of the order of 1–20 ohms per square. The use of low resistivity coatings of $SnO_x$ increases the efficiency of the cell by decreasing the amount of electrical energy which is lost in the $SnO_x$.

It also appears to be advantageous if the spraying occurs by depositing droplets which are as uniform as possible. If the spray consists of many small and many large droplets, the very small droplets are evaporated by the intense heat, approximate to the exposed surface of the substrate, and only the larger droplets reach the substrate. This causes some wastage of CdS and it implies that the rate at which the spray is applied should take into account the non-uniformity of the droplets.

In accordance with the method of our parent applications, supra, the glass substrate will be moving longitudinally through a plurality of heated zones, and the spray will occur by transverse passes across the substrate as the glass moves, so that the total quantity of spray reaching any given small area of the substrate will be uniform. The method allows for the fact that spray out of an air gun or out of an electrostatic spray gun does not have a uniform pattern.

The present cell is to be exposed to solar radiation via its glass substrate. The presence of the metallic compound in the CdS does not materially affect transparency of the CdS-Al layer, so that the heterojunction may be exposed via the latter.

It should be understood that various changes, modifications, and variations in the structure and function of the present invention may be effected without departing from the spirit and scope of the present invention as defined in the appended claims.

What is claimed is:

1. A photovoltaic cell, comprising
an electrically conductive substrate,
a first layer containing CdS, a second layer of $Cu_xS$ superposed on said first layer and forming a photovoltaic heterojunction therewith, and an electrode contacting said second layer, said first layer containing a compound of a selected metal in an amount effective to provide at least a portion of said CdS in said first layer with an amorphous structure resistant to permeation by said $Cu_xS$ through said first layer to said electrically conductive substrate.

2. A photovoltaic cell according to claim 1, wherein said compound of said selected metal is formed from a solution containing a cadmium compound and a salt of said selected metal, said selected metal being at least 10 molar percent of the total metal content of said solution.

3. A photovoltaic cell according to claim 1 or claim 2, wherein said compound of said selected metal is included in the greatest amount in said first layer adjacent said electrically conductive substrate and in the least amount in said first layer remote from said electrically conductive substrate.

4. A photovoltaic cell according to claim 1 or claim 2, wherein said first layer includes a first film component containing CdS and said compound of said selected metal, and a second film component containing, polycrystalline CdS.

5. A photovoltaic cell according to claim 4, wherein said first and second film components are each formed to a thickness of 1–4 microns.

6. A photovoltaic cell according to claim 5, wherein said selected metal is from the group consisting of aluminum and zirconium.

7. A photovoltaic cell, comprising an electrically conductive substrate a first layer containing CdS, a second layer of $Cu_xS$ superposed on said first layer and forming a photovoltaic heterojunction therewith, and an electrode contacting said second layer, said first layer containing a compound of aluminum or zirconium in an amount effective to provide at least a portion of said CdS in said first layer with an amorphous structure resistant to permeation by said $Cu_xS$ through said first layer to said electrically conductive substrate.

8. A photovoltaic cell according to claim 7, wherein said compound of said aluminum or zirconium is formed from a solution containing a cadmium compound and a salt of said aluminum or zirconium, the aluminum or zirconium content being at least 10 molar percent of the total metal content of said solution.

9. A photovoltaic cell according to claim 7 or claim 8, wherein said compound of said selected metal is included in the greatest amount in said first layer adjacent said electrically conductive substrate and in the least amount in said first layer remote from said electrically conductive substrate.

10. A photovoltaic cell according to claim 7 or claim 8, wherein said first layer includes a first film component containing CdS and said compound of said aluminum or zirconium, and a second film component containing polycrystalline CdS.

11. A photovoltaic cell according to claim 10, wherein said first and second film components are each formed to a thickness of 1–4 microns.

12. In a photovoltaic cell having an electrically conductive substrate, a first layer containing CdS, a second layer of $Cu_xS$ superposed on said first layer and forming a photovoltaic heterojunction therewith, and an electrode contacting said second layer, an improved first layer comprising a compound of a selected metal in an amount effective to provide at least a portion of said CdS in said first layer with an amorphous structure resistant to permeation by said $Cu_xS$ through said first layer to said electrically conductive substrate.

13. A photovoltaic cell according to claim 12, wherein said compound of said selected metal is formed from a solution containing a cadmium compound and a salt of said selected metal, said selected metal being at least 10 molar percent of the total metal content of said solution.

14. A photovoltaic cell according to claim 12 or claim 13, wherein said compound of said selected metal is included in the greatest amount in said first layer adjacent said electrically conductive substrate and in the least amount in said first layer remote from said electrically conductive substrate.

15. A photovoltaic cell according to claim 12 or claim 13, wherein said first layer includes a first film component containing CdS and said compound of said selected metal, and a second film component containing polycrystalline CdS.

16. A photovoltaic cell according to claim 15, wherein said first and second film component layers are each formed to a thickness of 1–4 microns.

17. A photovoltaic cell according to claim 16, wherein said selected metal is from the group consisting of aluminum and zirconium.

*18. An improved photovoltaic cell having an electrically conductive base, a first layer of polycrystalline semiconductor material, a second layer of material forming a heterojunction with said semiconductor material, and an electrode contacting said second layer, wherein the improvement comprises:*

*said first layer of semiconductor material having a portion which is resistant to permeation through said first layer to said base by materials forming said heterojunction.*

*19. An improved photovoltaic cell according to claim 18, wherein said first layer varies from a first material structure adjacent said base to a second material structure adjacent said heterojunction, said first structure being resistant to said permeation.*

*20. An improved photovoltaic cell according to claim 19, wherein said first and second material structures each form distinct first and second sublayers, respectively, of said first layer.*

*21. An improved photovoltaic cell according to claims 19 or 20, wherein said first material structure includes a first crystallite size and said second material structure includes a second crystallite size.*

* * * * *